United States Patent [19]

Ishii

[11] Patent Number: 4,698,808
[45] Date of Patent: Oct. 6, 1987

[54] METHOD FOR DETECTING INTERMITTENT ERROR IN VOLATILE MEMORY

[75] Inventor: Takashi Ishii, Yamato, Japan

[73] Assignee: International Business Machines Corporation, Armonk, N.Y.

[21] Appl. No.: 806,076

[22] Filed: Dec. 5, 1985

[30] Foreign Application Priority Data

Dec. 14, 1984 [JP] Japan ................................ 59-263157

[51] Int. Cl.$^4$ ............................................. G06F 11/16
[52] U.S. Cl. ........................................ 371/21; 371/53
[58] Field of Search ...................... 371/53, 54, 21, 66, 371/63, 67; 365/202; 364/200, 900

[56] References Cited

U.S. PATENT DOCUMENTS

| | | | |
|---|---|---|---|
| 4,092,732 | 5/1978 | Ouchi | 371/53 |
| 4,354,251 | 10/1982 | Hellwig | 371/21 |
| 4,566,106 | 1/1986 | Check | 371/21 |

*Primary Examiner*—Michael R. Fleming
*Attorney, Agent, or Firm*—Frederick D. Poag; Joseph J. Connerton

[57] ABSTRACT

Primary and secondary data save areas are established in a volatile memory (CMOS) which is backed up with a battery. The same predetermined data are stored in the primary and secondary data areas together with check sum. At a power on time, the data of the primary area are added together and the data of the secondary area are added together. When both of results of the addition are equal to the check sum, no error is detected. When only one of results of addition is different from the check sum, an intermittent error is detected. When both of results of addition are different from the check sum, battery exhausted condition is detected. If the intermittent error is detected, data of one area whose result of addition is equal to the check sum are copied to other area whose result addition is different from the check sum.

8 Claims, 3 Drawing Figures

METHOD FOR DETECTING INTERMITTENT ERROR IN VOLATILE MEMORY

BACKGROUND OF THE INVENTION

1. Field of the Invention

This invention relates to a method for detecting an intermittent error in a volatile memory in which information to be stored is held with auxiliary batteries during the failure of the main power source.

2. Prior Art

Published Unexamined Japanese Patent Application Nos. 56-58197 (58197/81) and 58-199497 (199497/83) disclose a method for detecting the data error of a memory, in which the sum of memory data subjected to check is previously obtained, the sum is written in the memory, and on checking, the sum of data subjected to check is actually obtained, and this is compared with the sum stored in the memory.

Although the method of the prior art described above can be used to detect the data error of a memory, it cannot distinguish the error due to running down of the battery which backs up a volatile memory during power failure from an intermittent error (this error may occur due to, for example, static electricity when a person approaches the memory).

SUMMARY OF THE INVENTION

It is an object of this invention to provide a method for detecting an intermittent error in a volatile memory backed up by a battery distinguishably from an error due to running down of the battery.

It is another object of this invention to provide a method for detecting an intermittent error of a volatile memory, in which the intermittent error detected can be recovered easily.

According to this invention, the same data are written into two separate areas in a volatile memory, and the results of processing these two data in accordance with a predetermined rule (e.g., the sum) are stored as two check data. On checking, each data in the two separate areas in the memory is read and processed in accordance with the predetermined rule, the two data obtained from such processing are compared with the corresponding check data, and when only one of data obtained from said processing is not the same as the corresponding check data, the intermittent error is detected.

DETAILED DESCRIPTION

Figure 1A:
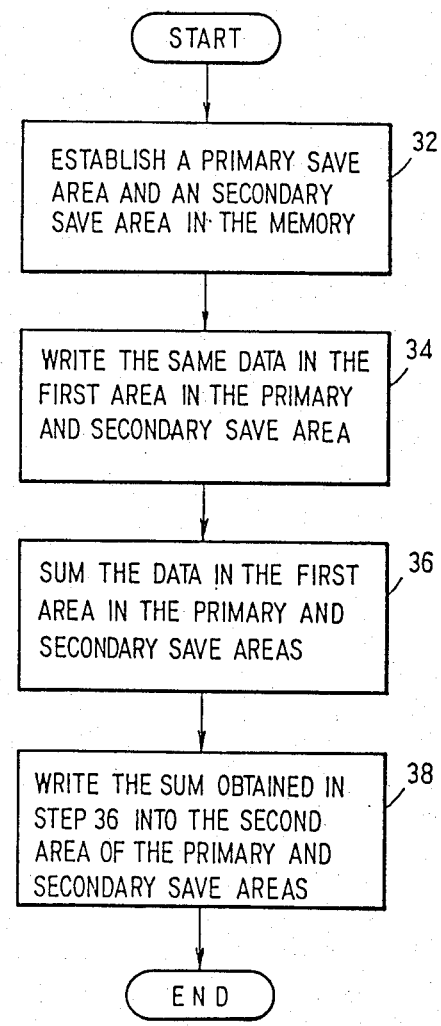
FIGS. 1A and 1B are flow charts showing an example of a method for detecting an intermittent error of a volatile memory according to this invention.
Figure 1B:
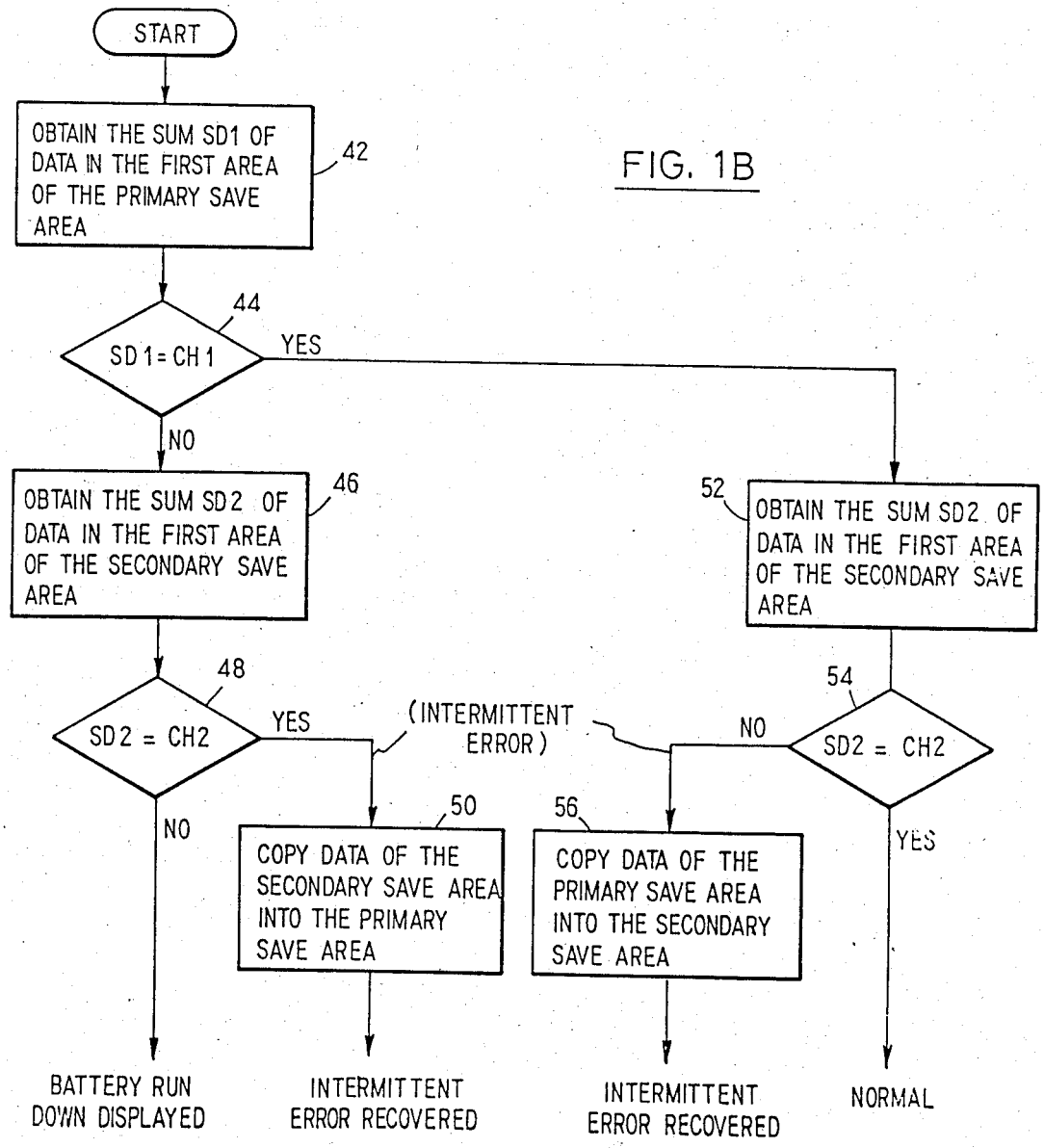
Figure 2:
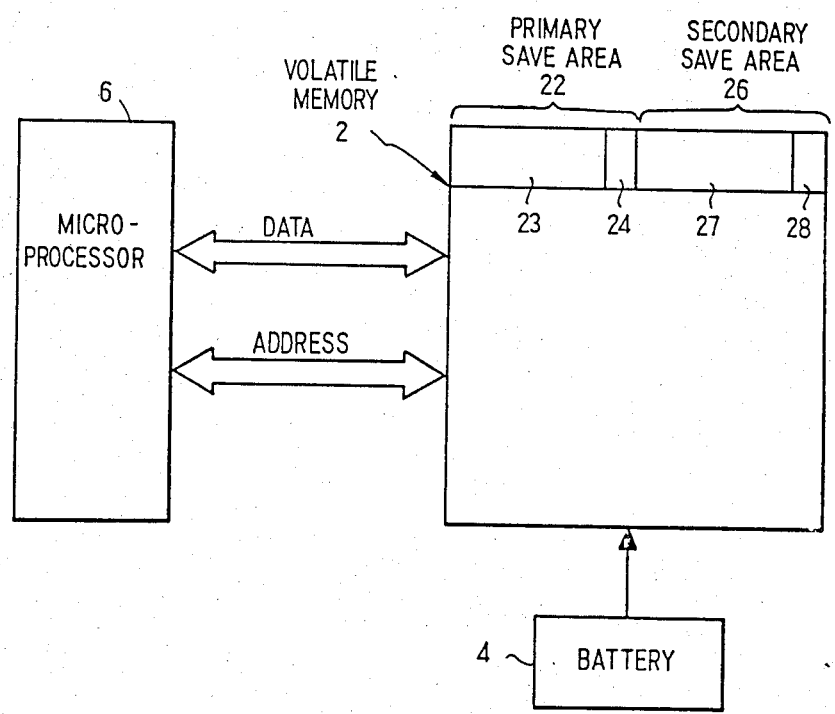
FIG. 2 is a block diagram illustrating the equipment used in the implementation of the method shown in FIGS. 1A and 1B.

FIGS. 1A and 1B show an embodiment of a method for detecting an intermittent error according to this invention, and FIG. 2 illustrates an interface between a volatile memory subjected to check and a microprocessor. The memory subjected to check according to this invention is a volatile memory 2 such as a CMOS in which information to be stored is held by an auxiliary battery 4 during the failure of the main power source. The methods illustrated by the flow charts in FIGS. 1A and 1B will be described with reference to the system implementation illustrated in FIG. 2.

As is shown in Step 32 of FIG. 1A, a primary data save area 22 and a secondary data save area 26 are established in volatile memory 2. These two save areas have the same storage capacity. The primary data save area 22 has a first storage area 23 and a second storage area 24. The second storage area 24 is established in the address following the last address of the first storage area 23. As well as the primary data save area 22, the secondary data save area 26 has a first storage area 27 and a second storage area 28, and the second storage area 28 is established in the address following the last address of the first storage area 27. The first storage areas 23 and 27 have the same storage capacity as each other, and the second storage areas 24 and 28 also have the same storage capacity as each other.

Next, as is shown in Step 34 of FIG. 1A, the microprocessor 6 addresses the first storage areas 23 and 27 in the primary and secondary data save areas 22 and 26, and writes the same data into these two storage areas. Data written may be optional data such as the identification number of a terminal unit and baud rate. Next, as is shown in Step 36, the microprocessor 6 obtains the sums of data written in the first storage areas. Then, as is shown in Step 38, the microprocessor 6 writes the sums obtained in Step 36 into the second storage areas 24 and 28 of the primary and secondary data save areas 22 and 26 as check data CH1 and CH2.

Checking of error of the memory 2 is started by interrupting the microprocessor 6 for detecting memory error when the power is on. By this interruption, the microprocesor 6 runs the program for detecting memory error. First, as is shown in Step 42 of FIG. 1B, it addresses the first storage area 23 in the primary data save area 22, reads data out of this area, and obtains the sum SD1 of these data. Next, the microprocessor 6 addresses the second storage area 24 in the primary data save area 22, and reads the check data CH1 out of this area. Then, as is shown in Step 44, the microprocessor 6 compares the sum SD1 with the check data, and if they are not identical with each other, the flow proceeds to Step 46.

In Step 46, the microprocessor 6 addresses the first storage area 27 in the secondary data save area 26, reads data out of this area, and obtains the sum SD2 of these data. Next, the microprocessor 6, addresses the second storage area 28 in the secondary data save area 26, and reads the check data CH2 out of this area. Then, as is shown in Step 48, the microprocessor 6 compares the sum SD2 with the check data CH2, and if they are not the same as each other, it judges that there is an error due to running down of the battery, and displays so.

If matching is detected in the comparison of Step 48, the microprocessor 6 judges that there is an intermittent error, and proceeds to recover from the intermittent error. As is shown in Step 50, the recovery is carried out by copying data of the first and second storage areas 27 and 28 of the secondary data save area 26 into the first and second storage areas 23 and 24 of the primary data save area 22, respectively.

If matching is detected in the comparison of Step 44, the microprocessor also executes the same processing as in Steps 46 and 48 as is shown in Steps 52 and 54. If the sum SD2 is found to be the same as the check data CH2 in Step 54, the memory 2 is judged to have no error.

In Step 54, if the sum SD2 is found to be not the same as the check data CH2, the microprocessor 6 judges that there is an intermittent error, and as is shown in Step 56, the microprocessor 6 proceeds to recover from the error by copying data of the first and second storage areas 23 and 24 of the primary data save area 22 into the first and second storage areas 27 and 28 of the secondary data save area 26, respectively.

According to the method of this invention, since the same data are stored in the primary and secondary data save areas 22 and 26, the recovery of data when an intermittent error is detected can be carried out by simple copying as described above. In addition if the first storage area is placed adjacent to the second storage area, as in this example, data transfer for copying can be performed easily.

In the above described embodiment the same data area written into the first storage areas of the primary and secondary data save areas before obtaining the sum of the data and writing the sum into the second storage areas of the primary and secondary data save areas. Instead of this, the same effect can be obtained by writing the data into the first storage area of the primary data save area, summing these data, writing the sum into the second storage area of the primary data save area, and writing the data and their sum stored in the primary data save area into the secondary data save area.

Furthermore, although the sum of data in the primary storage area is used as the check data in the above embodiment, the method of the invention is not limited by this, and the results of various operations such as exclusive OR and AND etc. may be used. In summary, any result of processing data in the first storage area in accordance with a predetermined rule may be used.

In addition, although checking is carried out when the power is turned on in the above embodiment, it may be performed by interrupting the microprocessor with an input device such as a keyboard as required.

As is obvious from the above description, since the data is two data save areas in a volatile memory are checked and an intermittent error is determined if one is right and the other is wrong in accordance with this invention, an intermittent error can be detected distinguishably from permanent error due to running down of the battery and the like.

In addition, since the same data are stored in two data save areas, the erroneous data can be recovered easily by copying the correct data into the data save area of the erroneous data.

What is claimed is:

1. A method for checking data loss in a battery backed volatile memory to distinguish between geometrically uniform data loss resulting from power decay throughout said memory and geometrically random data loss resulting from another cause, comprising the steps of, processing data stored in two separate save areas in said volatile memory to determine whether the data in one said area is correct, and the data in the other said area incorrect or whether the data in both of said areas is incorrect, whereby an isolated malfunction, signified by said incorrect data in one but not both of said areas can be distinguished from a permanent error due to discharge of said battery, and recovering from said data loss by copying said correct data into said area containing said incorrect data.

2. A method for detecting an intermittent error in a volatile memory in which information to be stored is maintained with an auxiliary battery during electric power failure comprising the steps of,
    (A) establishing primary and secondary save areas, each of which includes a first and a second storage area in said memory save areas;
    (B) writing the same data in said first storage area into each of said primary and secondary data save areas together with check data resulting from processing said data in accordance with a predetermined rule;
    (C) reading the output data from said first storage area into said primary and secondary data save areas;
    (D) processing data read out of said first storage area into said primary save area in accordance with said predetermined rule to obtain a first data configuration;
    (E) processing data read out of said first storage area into said secondary save area in accordance with said predetermined rule to obtain a second data configuration;
    (F) reading said check data stored in said second storage area into said primary and secondary data save areas;
    (G) comparing said check data from said second storage area in said primary save area with said first data configuration;
    wherein an intermittent error is detected when only one of said comparing steps reveals no matching.

3. A method according to claim 2, wherein said step (B) includes the further steps of:
    (I) writing the same data in said first storage area into each of said primary and secondary save areas;
    (J) obtaining said check data by processing said predetermined data stored in said first storage area in accordance with said predetermined rule; and
    (K) writing said check data in said second storage areas into said primary and secondary save areas.

4. A method according to claim 2 wherein said step (B) includes the further step of:
    (L) writing said same data into said first storage area of said prrmary data save area;
    (M) obtaining said check data by processing said data stored in said first storage area;
    (N) writing said check data in said second storage area of said primary save area; and
    (O) writing said predetermined data and said check data stored in said first and second storage area of said primary save area into said first and second storage area of said secondary save area respectively.

5. A method according to claim 2, wherein said check data is the sum of said predetermined data.

6. A method according to claim 2, wherein said processing said predetermined data in accordance with a predetermined rule is a predetermined logical operation.

7. A method according to claim 2, wherein said steps (C) through )H) are performed when power is turned on.

8. A method according to claim 2, wherein said steps (C) through (H) are performed when a processor associated with said memory is interrupted.

* * * * *